(12) United States Patent
Sasaki

(10) Patent No.: US 11,715,788 B2
(45) Date of Patent: Aug. 1, 2023

(54) SEMICONDUCTOR DEVICE

(71) Applicant: Murata Manufacturing Co., Ltd., Kyoto-fu (JP)

(72) Inventor: Kenji Sasaki, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 16 days.

(21) Appl. No.: 17/399,907

(22) Filed: Aug. 11, 2021

(65) Prior Publication Data
US 2022/0093775 A1 Mar. 24, 2022

(30) Foreign Application Priority Data
Sep. 18, 2020 (JP) .................. 2020-157314

(51) Int. Cl.
*H01L 29/737* (2006.01)
*H01L 23/00* (2006.01)
*H01L 29/205* (2006.01)
*H01L 29/08* (2006.01)

(52) U.S. Cl.
CPC .......... *H01L 29/7371* (2013.01); *H01L 24/13* (2013.01); *H01L 29/0826* (2013.01); *H01L 29/205* (2013.01); *H01L 2224/13025* (2013.01); *H01L 2924/10329* (2013.01); *H01L 2924/10338* (2013.01); *H01L 2924/13051* (2013.01)

(58) Field of Classification Search
CPC . H01L 29/7371; H01L 24/13; H01L 29/0826; H01L 2224/13025; H01L 2924/13051
See application file for complete search history.

(56) References Cited

U.S. PATENT DOCUMENTS

| 11,276,764 B1* | 3/2022 | Yang | H01L 27/0623 |
| 2008/0224174 A1 | 9/2008 | Sasaki et al. | |
| 2019/0058054 A1 | 2/2019 | Sasaki et al. | |
| 2019/0109066 A1* | 4/2019 | Kondo | H01L 23/49844 |
| 2020/0006536 A1 | 1/2020 | Sasaki et al. | |

FOREIGN PATENT DOCUMENTS

JP 2016-130540 A 7/2016

* cited by examiner

*Primary Examiner* — Syed I Gheyas
(74) *Attorney, Agent, or Firm* — Studebaker & Brackett PC

(57) ABSTRACT

At least one transistor is arranged on a substrate. A collector layer and a base layer of the transistor compose a collector mesa having a substantially mesa shape and the collector mesa has side faces tilting with respect to the substrate so that the dimension of a top face in a first direction of a plane of the substrate is smaller than the dimension of a bottom face therein. A first insulating film covering the transistor is arranged on the substrate. A first-layer emitter line that extends from an area overlapped with the top face of the collector mesa to areas overlapped with at least part of the tilting side faces of the collector mesa in a plan view is arranged on the first insulating film. A second-layer emitter line and an emitter bump are arranged on the first-layer emitter line.

13 Claims, 17 Drawing Sheets

SEMICONDUCTOR DEVICE

CROSS-REFERENCE TO RELATED APPLICATION

This application claims benefit of priority to Japanese Patent Application No. 2020-157314, filed Sep. 18, 2020, the entire content of which is incorporated herein by reference.

BACKGROUND

Technical Field

The present disclosure relates to a semiconductor device.

Background Art

Semiconductor devices including hetero-junction bipolar transistors (HBTs) or the likes are used for power amplifiers in transmission circuits used in mobile phones and so on. Characteristics of the transistors are degraded with increase in temperature due to self-heating of the transistors through amplification operations. In order to suppress the degradation of the characteristics of the transistors, it is preferred that the transistors, which are heat sources, efficiently radiate heat to the outside of the semiconductor devices.

In a configuration in which the semiconductor device is face-down mounted on a module substrate with an element formation surface of a semiconductor substrate being opposed to the module substrate, the heat generated in the transistors is conducted to the module substrate via bumps (for example, refer to Japanese Unexamined Patent Application Publication No. 2016-130540).

The amount of heat generation in the transistors is increased with an increase of the operating frequency of the power amplifier and an increase of the output. In order to suppresses an increase in temperature of the transistors, it is desirable that the heat be efficiently conducted from the transistors to the bumps.

SUMMARY

Accordingly, the present disclosure provides a semiconductor device capable of reducing the thermal resistance of a heat transfer path from a transistor to a bump.

A semiconductor device according to an embodiment of the present disclosure includes a substrate and at least one transistor including a collector layer, a base layer, and an emitter layer, which are laminated on the substrate. At least part of the collector layer and the base layer of the transistor compose a collector mesa having a substantially mesa shape and the collector mesa has side faces tilting with respect to the substrate so that a dimension of a top face in a first direction of a plane of the substrate is smaller than a dimension of a bottom face therein. The semiconductor device further includes a first insulating film that is a first-layer interlayer insulating film with respect to the substrate, which is arranged on the substrate and which covers the transistor; a first-layer emitter line that is arranged on the first insulating film, that is electrically connected to the emitter layer of the transistor via an opening provided in the first insulating film, and that extends from an area where the first-layer emitter line is overlapped with the top face of the collector mesa to areas where the first-layer emitter line is overlapped with at least part of the tilting side faces of the collector mesa in a plan view. The semiconductor also includes a second insulating film that is arranged on the first-layer emitter line and that has an opening included in the first-layer emitter line in a plan view; and a bump that is arranged on the second insulating film and that is electrically connected to the first-layer emitter line via the opening provided in the second insulating film.

The first-layer emitter line composes part of a heat transfer path from the transistor to the bump. Since the first-layer emitter line extends from the area where the first-layer emitter line is overlapped with the top face of the collector mesa to the areas where the first-layer emitter line is overlapped with at least part of the tilting side faces of the collector mesa in a plan view, the thermal resistance of the heat transfer path from the transistor to the bump is reduced.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor device according to a first embodiment will now be described with reference to FIG. 1 to FIG. 5.

Figure 1:
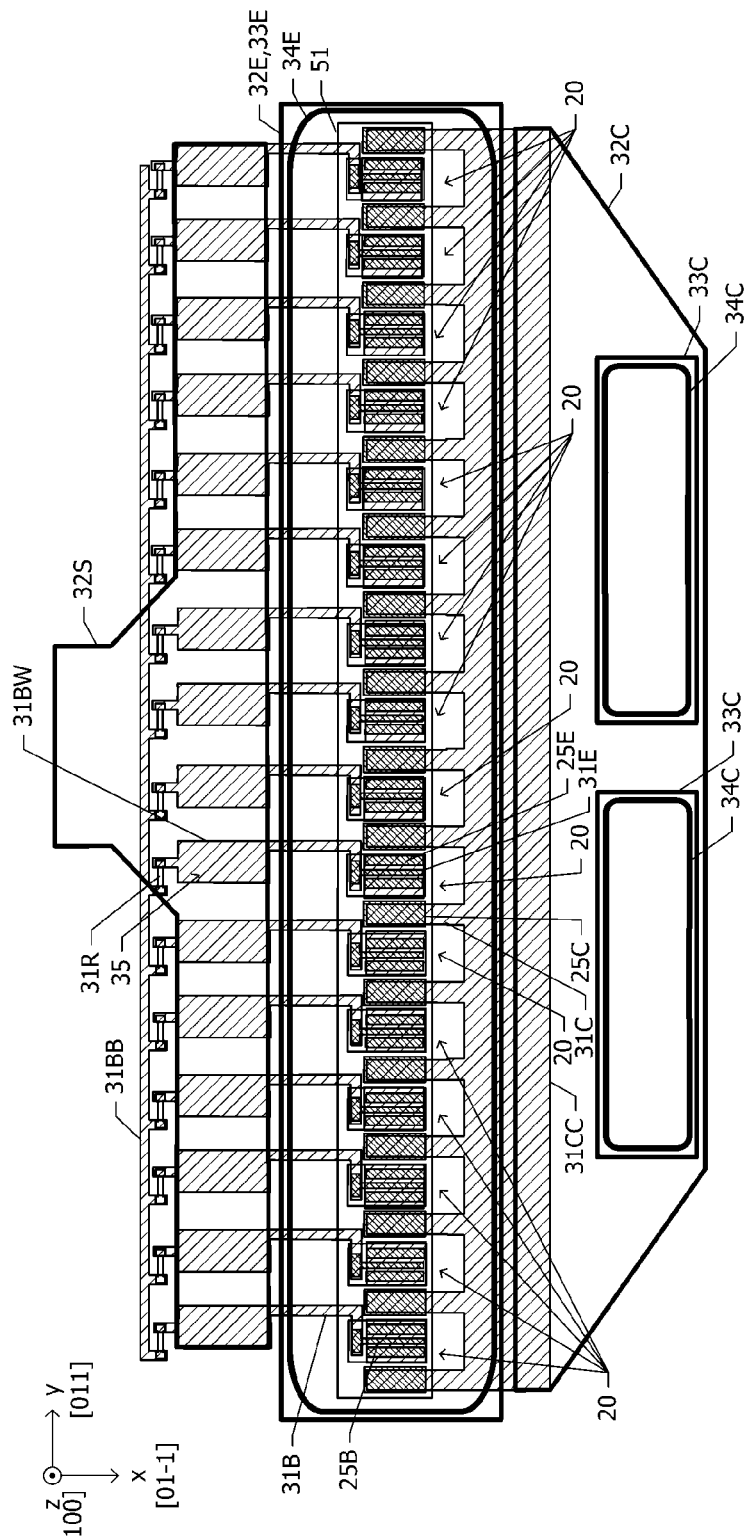
FIG. 1 is a diagram illustrating the positional relationship in a plan view between the respective components in a semiconductor device according to a first embodiment.

FIG. 1 is a diagram illustrating the positional relationship in a plan view between the respective components in the semiconductor device according to the first embodiment. Multiple transistors 20 are arranged in line in one direction on one surface (may be referred to as an element formation surface) of a substrate made of semiconductor. A GaAs substrate on a (100) face is used as the substrate made of semiconductor. An xyz Cartesian coordinate system is defined in which a [011] direction is the positive direction of the y axis, a [01-1] direction is the positive direction of the x axis, and a [100] direction is the positive direction of the z axis. The direction in which the multiple transistors 20 are aligned is parallel to the y direction.

A sub-collector layer 51 made of n-type GaAs is arranged on part of a surface portion of a substrate 50. The area excluding the sub-collector layer 51 in a plan view is an element isolation area insulated through injection of impurities. The sub-collector layer 51 has a long shape in the y direction and the multiple transistors 20 are included in the common sub-collector layer 51 in a plan view.

Collector electrodes 25C, a base electrode 25B, and emitter electrodes 25E are connected to each of the multiple transistors 20. Referring to FIG. 1, the collector electrodes 25C, the base electrodes 25B, and the emitter electrodes 25E are subjected to right upward hatching. The collector electrode 25C is arranged between the two transistors 20 that are adjacent to each other in the y direction. The collector electrode 25C is also arranged outside each of the transistors 20 positioned on both ends. The configuration of each of the multiple transistors 20 will be described in detail below with reference to FIG. 2 and FIG. 3.

Multiple collector lines 31C, multiple base lines 31B, and multiple emitter lines 31E on a first layer are arranged on an interlayer insulating film (not illustrated in FIG. 1) covering the collector electrodes 25C, the base electrodes 25B, and the emitter electrodes 25E. The first layer lines are subjected to right downward hatching in FIG. 1. The right downward hatching is rougher than the hatching added to the collector electrodes 25C and so on.

The multiple emitter lines 31E are overlapped with the emitter electrodes 25E connected to the corresponding transistors 20 in a plan view. The emitter lines 31E are connected to the emitter electrodes 25E below the emitter lines 31E. A second-layer emitter line 32E, a third-layer emitter line 33E, and an emitter bump 34E are arranged so as to include the multiple transistors 20 in a plan view. The emitter bump 34E is electrically connected to the emitter electrodes 25E via the emitter lines 33E, 32E, and 31E.

The multiple collector lines 31C are led in the positive direction of the x axis from areas where the multiple collector lines 31C are overlapped with the respective multiple collector electrodes 25C. The respective multiple collector lines 31C are connected to the collector electrodes 25C. A first-layer collector common line 31CC is arranged at the positive side of the x axis with respect to the multiple transistors 20. The collector common line 31CC is arranged in the same layer as that of the collector lines 31C and is connected to the multiple collector lines 31C.

A second-layer collector line 32C is arranged so as to be partially overlapped with the collector common line 31CC. The second-layer collector line 32C is connected to the collector common line 31CC in an area where the second-layer collector line 32C is overlapped with the collector common line 31CC. Two third-layer collector lines 33C are arranged so as to be included in the second-layer collector line 32C. Collector bumps 34C are arranged so as to be overlapped with the respective third-layer collector lines 33C. The collector bumps 34C are electrically connected to the collector electrodes 25C via the collector lines 33C and 32C, the collector common line 31CC, and the collector lines 31C.

The first-layer multiple base lines 31B are lead in the positive direction of the y axis from areas where the first-layer multiple base lines 31B are overlapped with the respective multiple base electrodes 25B and, then, extend in the negative direction of the x axis. The multiple base lines 31B are connected to a common base bias input line 31BB via the corresponding resistor elements 31R. The base bias input line 31BB is arranged in the same layer as that of the first-layer base lines 31B. Base bias is supplied from the base bias input line 31BB to the transistors 20 via the resistor elements 31R, the base lines 31B, and the base electrodes 25B.

Each of the multiple base lines 31B includes an expanded portion 31BW having an increased width between the portion where the base line 31B is connected to the base electrode 25B and the portion where the base line 31B is connected to the resistor element 31R. A common radio-frequency signal input line 32S is arranged so as to be overlapped with the multiple expanded portions 31BW. The radio-frequency signal input line 32S is arranged in the same layer as that of the second-layer emitter line 32E and so on. Capacitor elements 35 are formed in areas where the expanded portions 31BW are overlapped with the radio-frequency signal input line 32S. A radio-frequency signal is supplied from the radio-frequency signal input line 32S to the transistors 20 via the capacitor elements 35, the base lines 31B, and the base electrodes 25B.

The configuration of the transistor 20 and the configuration of the electrodes and the lines, which are connected to the transistor 20, will now be described with reference to FIG. 2 and FIG. 3.

Figure 2:
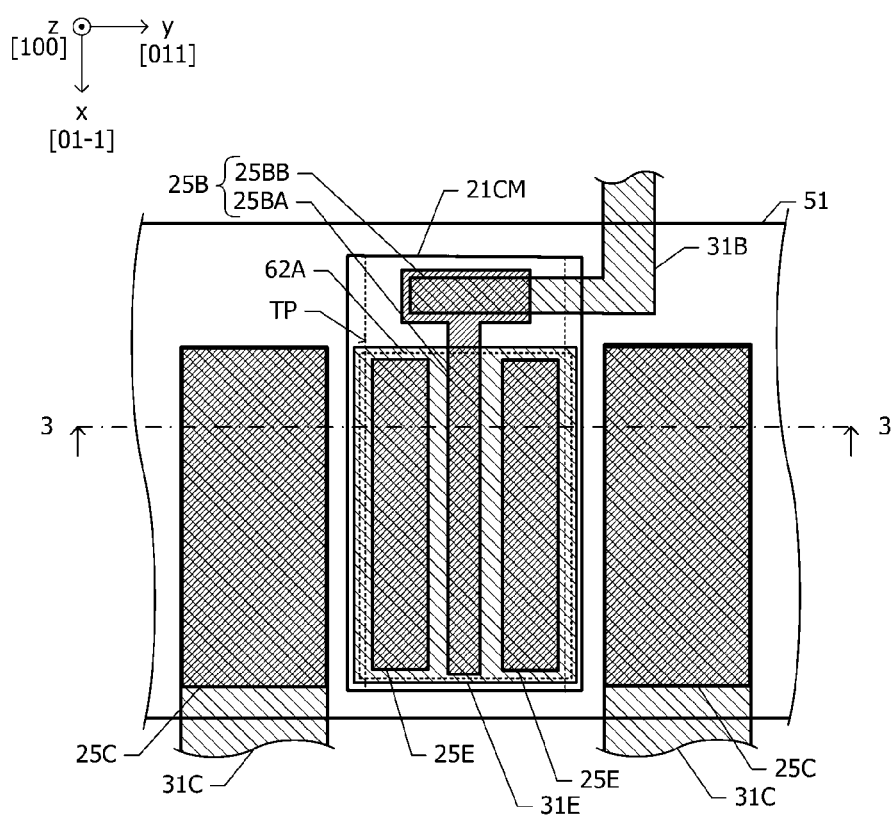
FIG. 2 is a diagram illustrating the positional relationship in a plan view between one transistor and electrodes and lines, which are connected to the transistor.

FIG. 2 is a diagram illustrating the positional relationship in a plan view between one transistor 20 and the electrodes and the lines, which are connected to the transistor 20. FIG. 3 is a cross-sectional view taken along the alternate long and short dash line 3-3 in FIG. 2. The collector electrodes 25C, the base electrode 25B, and the emitter electrodes 25E are subjected to right upward hatching and the first-layer lines are subjected to right downward hatching also in FIG. 2, as in FIG. 1. The right downward hatching is rougher than the hatching added to the collector electrodes 25C and so on. The sub-collector layer 51 made of n-type GaAs is arranged on a partial area of the substrate 50 made of semi-insulating GaAs. The area excluding the sub-collector layer 51 is the insulating element isolation area. In the two surfaces orthogonal to the thickness direction of the substrate 50, the surface on which the sub-collector layer 51 is arranged is referred to as a top face.

A collector mesa 21CM having a substantially mesa shape is arranged on the sub-collector layer 51. The collector mesa 21CM has a top face facing the same direction as the top face of the substrate 50, a bottom face, which is the boundary face with the sub-collector layer 51, and side faces with which the top face is connected to the bottom face. The collector mesa 21CM includes a collector layer 21C, a base layer 21B, and an emitter layer 21E, which are laminated in this order from the substrate 50 side. For example, the collector layer 21C is made of n-type GaAs, the base layer 21B is made of p-type GaAs, and the emitter layer 21E is made of n-type InGaP.

The collector mesa 21CM has a substantially rectangular shape having long sides parallel to the x direction and short sides parallel to the y direction in a plan view. The side faces parallel to the x direction of the collector mesa 21CM tilt with respect to the top face of the substrate 50 and the tilt angle is about 90° or less. Accordingly, the dimension in the y direction of the top face of the collector mesa 21CM is smaller than the dimension in the y direction of the bottom face thereof. The structure having such side faces is called a normal mesa structure. The margins of the top face of the collector mesa 21CM are represented by broken lines TP in FIG. 2. The mesa structure having the tilting side faces is capable of being formed through, for example, wet etching using different etching speeds for different orientations of the crystal face. Use of the wet etching causes the side faces parallel to the y axis of the collector mesa 21CM to be tilting faces having the tilt angle exceeding about 90°. The structure having such side faces is called an inverted mesa structure.

Two emitter mesas 21EM are arranged in line in the y direction on the top face of the collector mesa 21CM. The emitter mesas 21EM each include, for example, an n-type GaAs layer and an n-type InGaAs layer on the n-type GAAs layer.

The emitter electrode 25E is arranged on each of the two emitter mesas 21EM. The emitter electrode 25E has a long shape in the x direction and has substantially the same shape as that of the emitter mesa 21EM in a plan view. Such a structure is formed through, for example, a self-alignment process using the emitter electrodes 25E as etching masks. The emitter electrodes 25E are electrically connected to the emitter layer 21E via the emitter mesas 21EM.

The base electrode 25B includes a main portion 25BA having long sides along the x direction and a contact portion 25BB connected to the end portion at the negative side of the x axis of the main portion 25BA. The main portion 25BA of the base electrode 25B is arranged between the two emitter electrodes 25E. The base electrode 25B is electrically connected to the base layer 21B via an alloying area passing through the emitter layer 21E in the thickness direction.

The collector electrode 25C is arranged at each of two positions sandwiching the collector mesa 21CM in the y direction. The collector electrodes 25C are electrically connected to the collector layer 21C via the sub-collector layer 51.

A first-layer interlayer insulating film (hereinafter referred to as a first insulating film 61) is arranged on the substrate 50 so as to cover the emitter electrodes 25E, the base electrode 25B, the collector electrodes 25C, and the sub-collector layer 51. The first insulating film 61 is made of, for example, an inorganic insulating material, such as SiN. The emitter line 31E, the collector lines 31C, and the base line 31B on the first layer are arranged on the first insulating film 61.

The first-layer emitter line 31E extends from an area where the first-layer emitter line 31E is overlapped with one emitter electrode 25E to an area where the first-layer emitter line 31E is overlapped with the other emitter electrode 25E across the main portion 25BA of the base electrode 25B in a plan view. The emitter line 31E extends in the y direction from the top face of the collector mesa 21CM to part of the tilting side faces of the collector layer 21C in a plan view. The emitter line 31E is connected to the emitter electrodes 25E via an opening provided in the first insulating film 61 in the areas where the emitter line 31E is overlapped with the emitter electrodes 25E.

The first-layer collector lines 31C extend in the positive direction of the x axis from areas where the first-layer collector lines 31C are overlapped with the collector electrodes 25C in a plan view. The collector lines 31C are connected to the collector electrodes 25C via the opening provided in the first insulating film 61 in the areas where the first-layer collector lines 31C are overlapped with the collector electrodes 25C.

The first-layer base line 31B extends in the positive direction of the y axis from an area where the first-layer base line 31B is overlapped with the contact portion 25BB of the base electrode 25B to the outside of the collector mesa 21CM across the margin parallel to the x axis of the collector mesa 21CM. In addition, the base line 31B bends at a right angle outside the collector mesa 21CM and extends in the negative direction of the x axis. The base line 31B is connected to the contact portion 25BB via the opening provided in the first insulating film 61 in the area where the base line 31B is overlapped with the contact portion 25BB.

A second-layer interlayer insulating film (hereinafter referred to as a second insulating film 62) is arranged on the emitter line 31E, the collector lines 31C, and the base line 31B on the first layer. The second insulating film 62 has an opening 62A including the first-layer emitter line 31E in a plan view. The opening 62A is represented by broken lines in FIG. 2.

The second-layer emitter line 32E is arranged on the second insulating film 62. The second-layer emitter line 32E is connected to the first-layer emitter line 31E via the opening 62A provided in the second insulating film 62. The third-layer emitter line 33E is arranged on the second-layer emitter line 32E, and the emitter bump 34E is arranged on the third-layer emitter line 33E.

Figure 3:
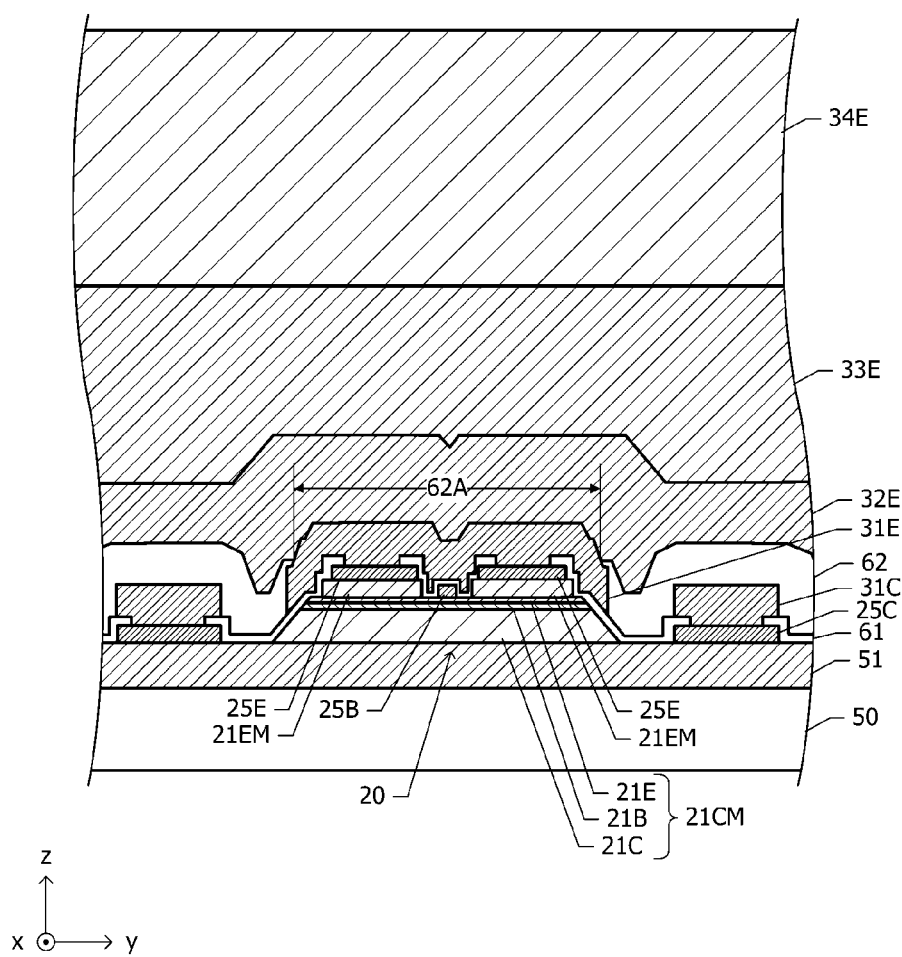
FIG. 3 is a cross-sectional view taken along the alternate long and short dash line 3-3 in FIG. 2.

An interlayer insulating film is arranged between the second-layer emitter line 32E and the third-layer emitter line 33E, although not illustrated in the cross section in FIG. 3. The third-layer emitter line 33E is connected to the second-layer emitter line 32E via an opening provided in the interlayer insulating film. A protective film is arranged between the third-layer emitter line 33E and the emitter bump 34E. The emitter bump 34E is connected to the third-layer emitter line 33E via an opening provided in the protective film.

The advantages of the first embodiment will now be described. During the operation of the transistors 20, collector current mainly flows in areas immediately below the emitter mesas 21EM of the collector layer 21C. Accordingly, these areas serve as a heat source. A heat transfer path from the heat source of the transistors 20 to a module substrate via the emitter electrodes 25E, the emitter lines 31E, 32E, and 33E, and the emitter bump 34E is formed in a state in which the semiconductor device according to the first embodiment is face-down mounted on the module substrate via the emitter bump 34E.

In order to suppress an excessive increase in the temperature of the transistors 20, the thermal resistance of the heat transfer path is desirably reduced. In the related art, the first-layer emitter line 31E is arranged in an area where the first-layer emitter line 31E is substantially overlapped with the emitter electrodes 25E and does not extend to the outside of the top face of the collector mesa 21CM. In other words, the dimension in the y direction of the first-layer emitter line 31E is smaller than the dimension in the y direction of the top face of the collector mesa 21CM. Accordingly, the dimension in the y direction of the top face of the collector mesa 21CM causes a bottleneck against the reduction in the thermal resistance of the heat transfer path from the transistors 20 to the module substrate.

In the first embodiment, the first-layer emitter line 31E extends toward both sides in the y direction from the top face of the collector mesa 21CM to the outside of the top face of the collector mesa 21CM in a plan view. The dimension in the y direction of the first-layer emitter line 31E is not restricted by the dimension in the y direction of the top face of the collector mesa 21CM. Accordingly, the dimension in the y direction of the top face of the collector mesa 21CM does not cause a bottleneck against the reduction in the thermal resistance of the heat transfer path from the transistors 20 to the module substrate. Consequently, it is possible to reduce the thermal resistance of the heat transfer path. The reduction in the thermal resistance of the heat transfer path enables degradation of characteristics due to the increase in the temperature of the transistors 20 to be suppressed.

In order to reduce the thermal resistance of the heat transfer path, the opening 62A provided in the second insulating film 62 is preferably increased in size as much as possible under the condition that the opening 62A is included in the first-layer emitter line 31E in a plan view. For example, in a plan view, the opening 62A is preferably expanded from an area where the opening 62A is overlapped with the top face of the collector mesa 21CM to areas where the opening 62A is overlapped with at least part of the tilting side faces.

Since the side faces extending in the x direction of the collector mesa 21CM tilt in the first embodiment, it is possible to suppress disconnection at the margins of the top face of the collector mesa 21CM to form the continuous emitter line 31E with high reproducibility even when the first-layer emitter line 31E is extended in the y direction to areas where the first-layer emitter line 31E is overlapped with part of the side faces of the collector mesa 21CM.

In order to achieve the sufficient advantages to reduce the thermal resistance of the heat transfer path, the opening provided in the interlayer insulating film between the second-layer emitter line 32E and the third-layer emitter line 33E and the opening provided in the protective film between the third-layer emitter line 33E and the emitter bump 34E preferably include the first-layer emitter line 31E in a plan view.

In the first embodiment, the first insulating film 61 is made of an inorganic insulating material, such as SiN. The thermal conductivity of the inorganic insulating material is sufficiently higher than the thermal conductivity of an organic insulating material. Accordingly, not only the areas where the emitter electrodes 25E are directly in contact with the first-layer emitter line 31E but also the first insulating film 61 immediately below the first-layer emitter line 31E function as part of the heat transfer path from the heat source of the transistors 20.

A result of calculation of the thermal resistance of the heat transfer path through simulation when the dimension in the y direction of the opening 62A (FIG. 3) provided in the second insulating film 62 is varied will now be described with reference to FIG. 4 and FIG. 5.

Figure 4:
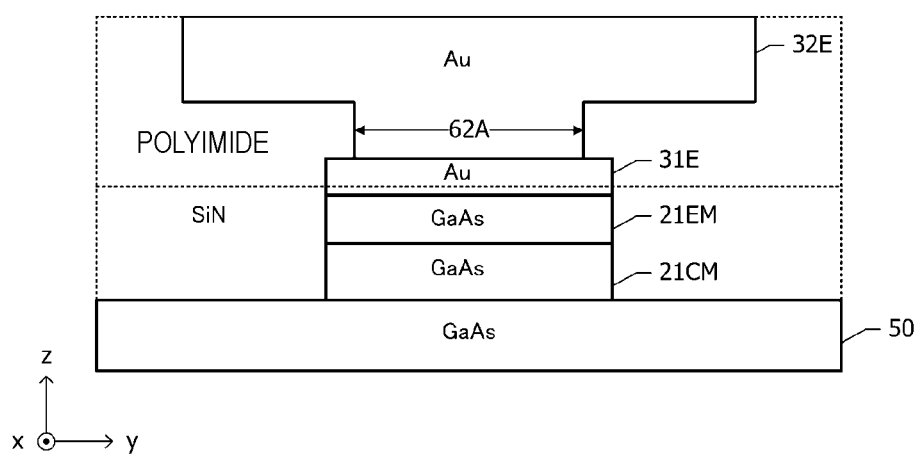
FIG. 4 is a cross-sectional view of part of an analysis model for calculating thermal resistance through simulation.

FIG. 4 is a cross-sectional view of part of an analysis model for calculating the thermal resistance through simulation. The collector mesa 21CM and the emitter mesa 21EM are arranged on the substrate 50, and the first-layer emitter line 31E is arranged on the emitter mesa 21EM. The second-layer emitter line 32E is connected to the first-layer emitter line 31E via the opening 62A. The third-layer emitter line 33E and the emitter bump 34E illustrated in FIG. 3 are arranged on the second-layer emitter line 32E, and the emitter bump 34E is connected to the module substrate. The module substrate is mounted on a parent substrate.

The substrate 50, the collector mesa 21CM, and the emitter mesa 21EM are made of GaAs, and Au is used for the first-layer emitter line 31E and the second-layer emitter line 32E. Cu is used for the third-layer emitter line 33E and the emitter bump 34E. The portion below a broken line of the first-layer emitter line 31E corresponds to the inside of the opening provided in the first insulating film 61, and the portion above the broken line thereof corresponds to an upper portion of the first insulating film 61.

Polyimide is used for the insulating film of the portion above the broken line of the first-layer emitter line 31E, and SiN is used for the insulating film below the broken line thereof. Steady-state analysis of the thermal resistance from the heat source of the transistors 20 was performed in two kinds of analysis models having different dimensions in the y direction of the opening 62A. The dimension in the y direction of a metal portion above the second-layer emitter line 32E is sufficiently larger than the dimension in the y direction of the opening 62A. Accordingly, the dimension in the y direction of the opening 62A causes a bottleneck against the reduction in the thermal resistance.

Figure 5:
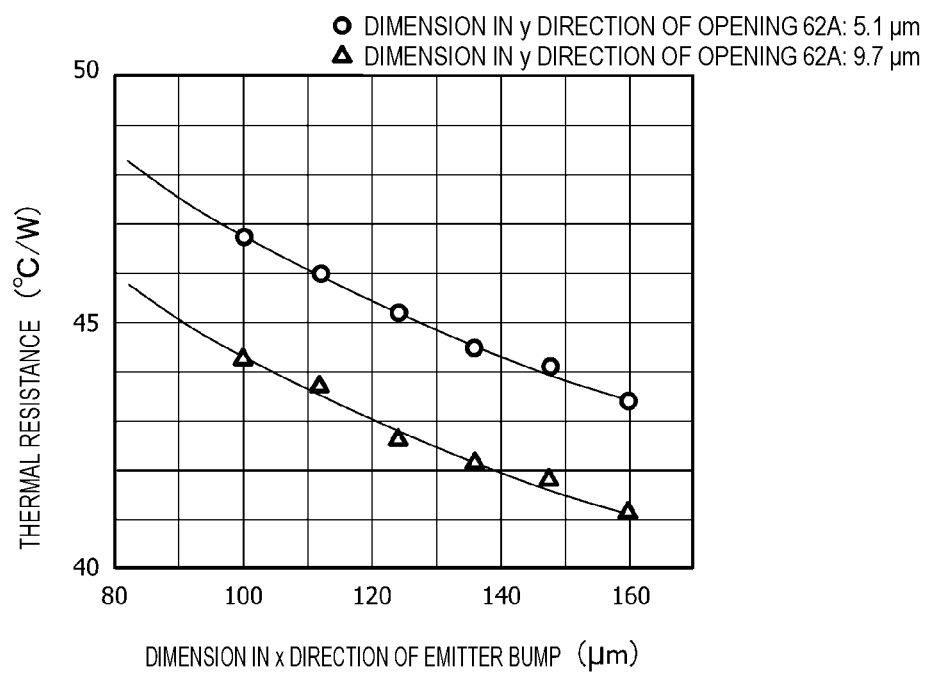
FIG. 5 is a graph indicating the thermal resistance calculated by varying the dimension in the x direction of an emitter bump in each of two kinds of analysis models.

FIG. 5 is a graph indicating the thermal resistance calculated by varying the dimension in the x direction of the emitter bump 34E (FIG. 1) in each of the two kinds of analysis models. Referring to FIG. 5, the horizontal axis represents the dimension in the x direction of the emitter bump 34E in "μm" and the vertical axis represents the thermal resistance in "° C./W". Circle symbols and triangular symbols in the graph in FIG. 5 indicate the thermal resistance of the analysis model having a dimension of about 5.1 μm in the y direction of the opening 62A and the thermal resistance of the analysis model having a dimension of about 9.7 μm in the y direction of the opening 62A, respectively.

At the same dimension in the x direction of the emitter bump 34E, the graph indicates that the thermal resistance is reduced by about 2.4° C./W when the dimension in the y direction of the opening 62A is increased from about 5.1 μm to about 9.7 μm. At the same thermal resistance, the graph indicates that the dimension in the x direction of the emitter bump 34E is decreased when the dimension in the y direction of the opening 62A is increased from about 5.1 μm to about 9.7 μm.

The simulation illustrated in FIG. 4 and FIG. 5 indicates that the thermal resistance of the heat transfer path from the transistors 20 to the module substrate is reduced with the increasing dimensions in the y direction of the first-layer emitter line 31E and the opening 62A (FIG. 2 and FIG. 3). In addition, the simulation also indicates that the dimension in the x direction of the emitter bump 34E (FIG. 1) is decreased at a constant thermal resistance with the increasing dimensions in the y direction of the first-layer emitter line 31E and the opening 62A (FIG. 2 and FIG. 3). As a result, it is possible to reduce the chip size of the semiconductor device.

Modifications of the first embodiment will now be described.

In the first embodiment, the collector mesa 21CM (FIG. 3) has a height from the boundary face between the collector layer 21C and the sub-collector layer 51 to the top face of the emitter layer 21E. As another configuration, the collector mesa 21CM may at least include part of the collector layer 21C and the base layer 21B. For example, a configuration may be adopted in which the collector layer 21C is composed a high-density collector layer having a relatively high doping density and a low-density collector layer having a relatively low doping density on the high-density collector layer and the collector mesa 21CM includes the low-density collector layer but does not include the high-density collector layer. In this case, the bottom face of the low-density collector layer corresponds to the bottom face of the collector mesa.

A configuration may be adopted in which the collector mesa 21CM includes the collector layer 21C and the base layer 21B and does not include the emitter layer. In this case, the top face of the base layer 21B corresponds to the top face of the collector mesa 21CM. One substantially mesa-shaped portion including at least part of the upper side of the collector layer 21C may be defined as the collector mesa 21CM.

Although the multiple transistors 20 are arranged in one sub-collector layer 51 in the semiconductor device (FIG. 1) according to the first embodiment, the sub-collector layer 51 may be divided and the sub-collector layer 51 may be arranged for each transistor 20. One collector electrode 25C is shared between the two transistors 20 arranged on both sides of the collector electrode 25C in the first embodiment. In contrast, in the configuration in which the sub-collector layer 51 is divided, the collector electrode 25C is not shared between the two transistors 20 and the collector electrode 25C arranged between the two adjacent transistors 20 is also divided.

Second Embodiment

A semiconductor device according to a second embodiment will now be described with reference to FIG. 6 and FIG. 7. A description of the components common to the semiconductor device (FIG. 1, FIG. 2, and FIG. 3) according to the first embodiment is omitted herein.

Figure 6:
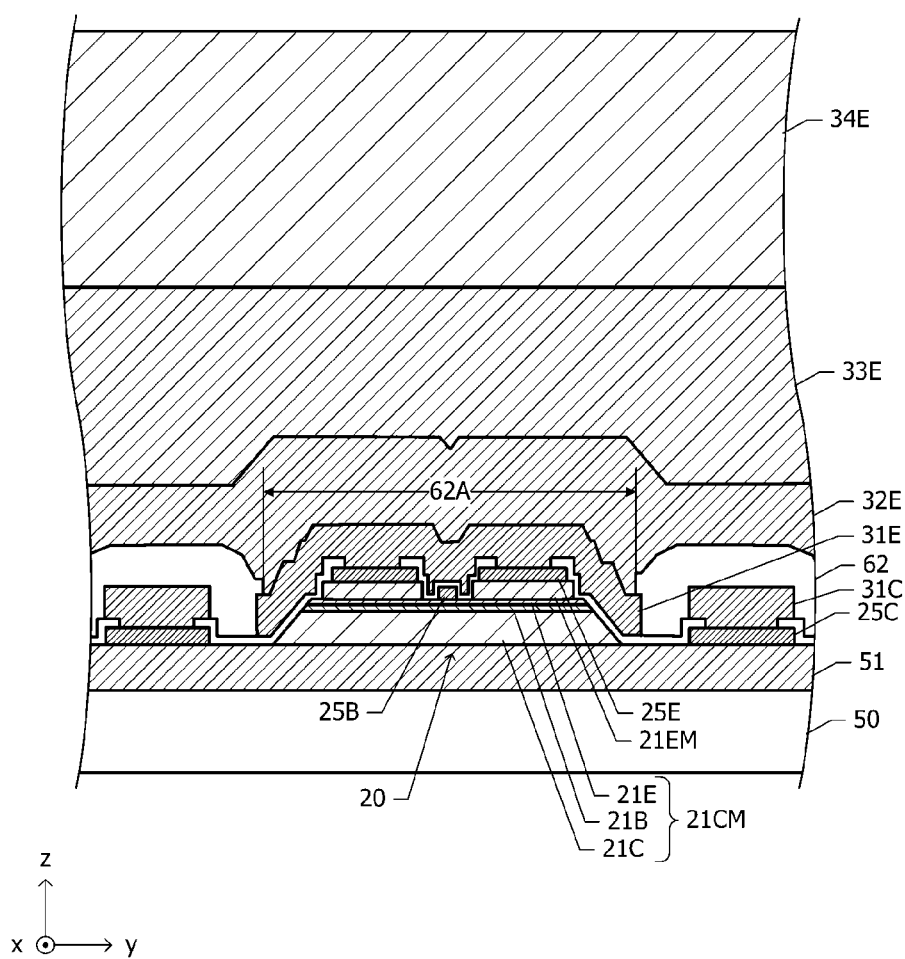
FIG. 6 is a cross-sectional view of part of a semiconductor device according to a second embodiment.

FIG. 6 is a cross-sectional view of part of the semiconductor device according to the second embodiment. Although the first-layer emitter line 31E (FIG. 2 and FIG. 3) extends in the y direction across the margins of the top face of the collector mesa 21CM in the first embodiment, the first-layer emitter line 31E does not reach the margins of the bottom face of the collector layer 21C. In contrast, in the second embodiment, the first-layer emitter line 31E extends in the y direction across the margins of the bottom face of the collector layer 21C, that is, across the lower ends of the tilting side faces of the collector mesa 21CM. The opening 62A provided in the second insulating film 62 also expands in the y direction across the margins of the bottom face of the collector layer 21C, in response to the extension of the first-layer emitter line 31E.

The minimum value of the spacing in the y direction between the first-layer emitter line 31E and the collector line 31C is determined by a process rule. In order to meet the process rule, the spacing between the collector line 31C and the collector layer 21C is also increased in response to the extension in the y direction of the first-layer emitter line 31E. In response to this, the spacing between the collector electrode 25C and the collector layer 21C is also increased.

The advantages of the second embodiment will now be described.

The dimensions in the y direction of the first-layer emitter line 31E and the opening 62A are increased in the second embodiment, compared with the first embodiment. Accordingly, since the area of the horizontal section of the bottleneck portion of the heat transfer path from the transistors 20 to the emitter bump 34E is increased, the thermal resistance is further reduced. Consequently, it is possible to suppress the degradation of the characteristics due to the increase in the temperature of the transistors 20.

A preferable range of the dimensions in the y direction of the first-layer emitter line 31E and the opening 62A will now be described with reference to FIG. 7.

Figure 7:
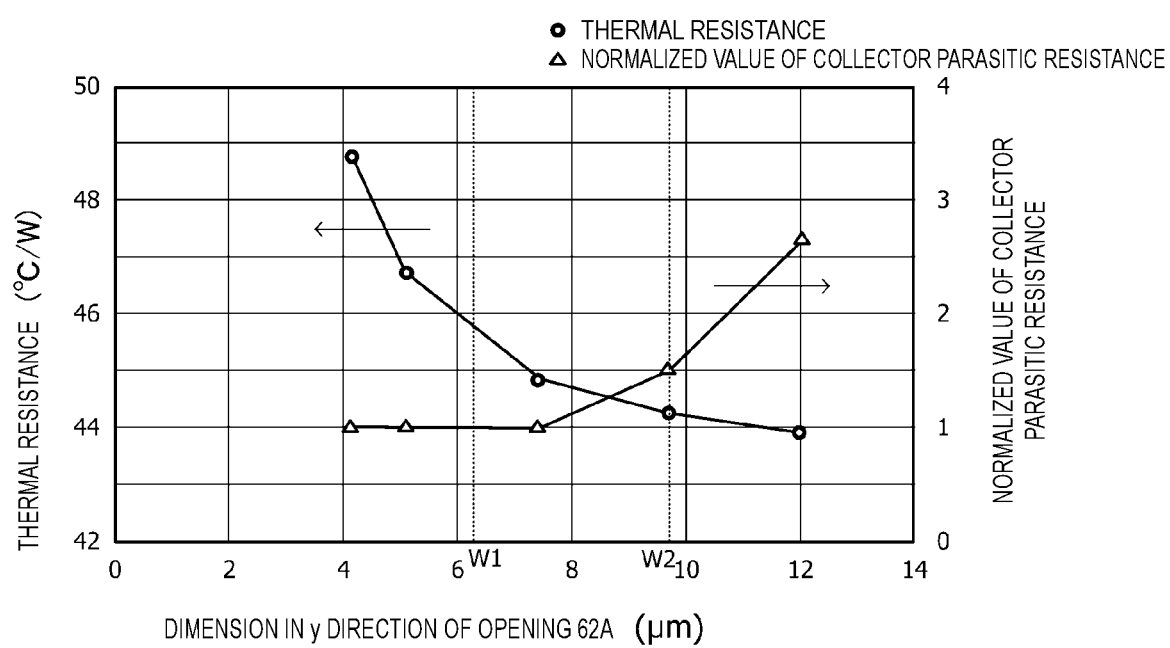
FIG. 7 is a graph indicating a result of calculation of the thermal resistance and collector parasitic resistance when the dimension in the y direction of an opening with which a first-layer emitter line is connected to a second-layer emitter line is varied.

FIG. 7 is a graph indicating a result of calculation of the thermal resistance and collector parasitic resistance when the dimension in the y direction of the opening 62A is varied. Referring to FIG. 7, the horizontal axis represents the dimension in the y direction of the opening 62A in "µm". The left vertical axis represents the thermal resistance in "° C./W" and the right vertical axis represents a normalized value of the collector parasitic resistance based on the minimum value. Circle symbols and triangular symbols in the graph in FIG. 7 indicate the thermal resistance and the normalized value of the collector parasitic resistance, respectively. The thermal resistance was calculated using the analysis models described above with reference to FIG. 4 and FIG. 5.

The area of the horizontal section of the bottleneck portion of the heat transfer path is increased as the dimension in the y direction of the opening 62A is increased. Accordingly, the thermal resistance is reduced with the increasing dimension in the y direction of the opening 62A.

In order to increase the dimension in the y direction of the opening 62A, it is necessary to extend the first-layer emitter line 31E including the opening 62A in a plan view in the y direction. In addition, it is necessary to ensure the spacing based on the process rule between the first-layer emitter line 31E and the collector line 31C. Accordingly, it is necessary to make the collector line 31C away from the collector mesa 21CM in response to the extension in the y direction of the first-layer emitter line 31E (FIG. 6).

In the configuration in which the position in the y direction of the collector line 31C substantially coincides with the position in the y direction of the collector electrode 25C, the collector electrode 25C is also made away from the collector mesa 21CM. When the spacing between the collector mesa 21CM and the collector electrode 25C is increased, the collector parasitic resistance is increased. In the graph illustrated in FIG. 7, the normalized value of the collector parasitic resistance is kept constant in a range in which the dimension in the y direction of the opening 62A is smaller than or equal to about 7.5 µm. This means that it is not necessary to move the collector line 31C even when the dimension in the y direction of the opening 62A is increased within the range in which the dimension in the y direction of the opening 62A is smaller than or equal to about 7.5 µm.

When the dimension in the y direction of the opening 62A is increased in a range in which the dimension in the y direction of the opening 62A is larger than or equal to about 7.5 µm, the dimension in the y direction of the first-layer emitter line 31E is also increased. The collector line 31C and the collector electrode 25C are made away from the collector mesa 21CM with the extension in the y direction of the first-layer emitter line 31E. Accordingly, the collector parasitic resistance is increased.

The state in which the dimension in the y direction of the opening 62A is W1 corresponds to a state in which the margins of the opening 62A coincide with the margins of the top face of the collector mesa 21CM. In order to suppress the degradation of the characteristics due to the increase in the collector parasitic resistance, the collector parasitic resistance is preferably kept at a value lower than or equal to about 1.5 times of the minimum value. In the example indicated in FIG. 7, the dimension in the y direction of the opening 62A is preferably set to a value lower than or equal to W2.

In order to reduce the thermal resistance and suppress the increase in the collector parasitic resistance, the dimension in the y direction of the opening 62A is preferably set to a value within a range not lower than W1 and not higher than W2. In the example indicated in FIG. 7, W1 is about 6.3 µm and W2 is about 9.6 µm. In other words, the amount of expansion on each side of the y direction from the margin of the top face of the collector mesa 21CM to the margin of the opening 62A is preferably set to about 1.65 µm or less.

A modification of the second embodiment will now be described with reference to FIG. 8.

Figure 8:
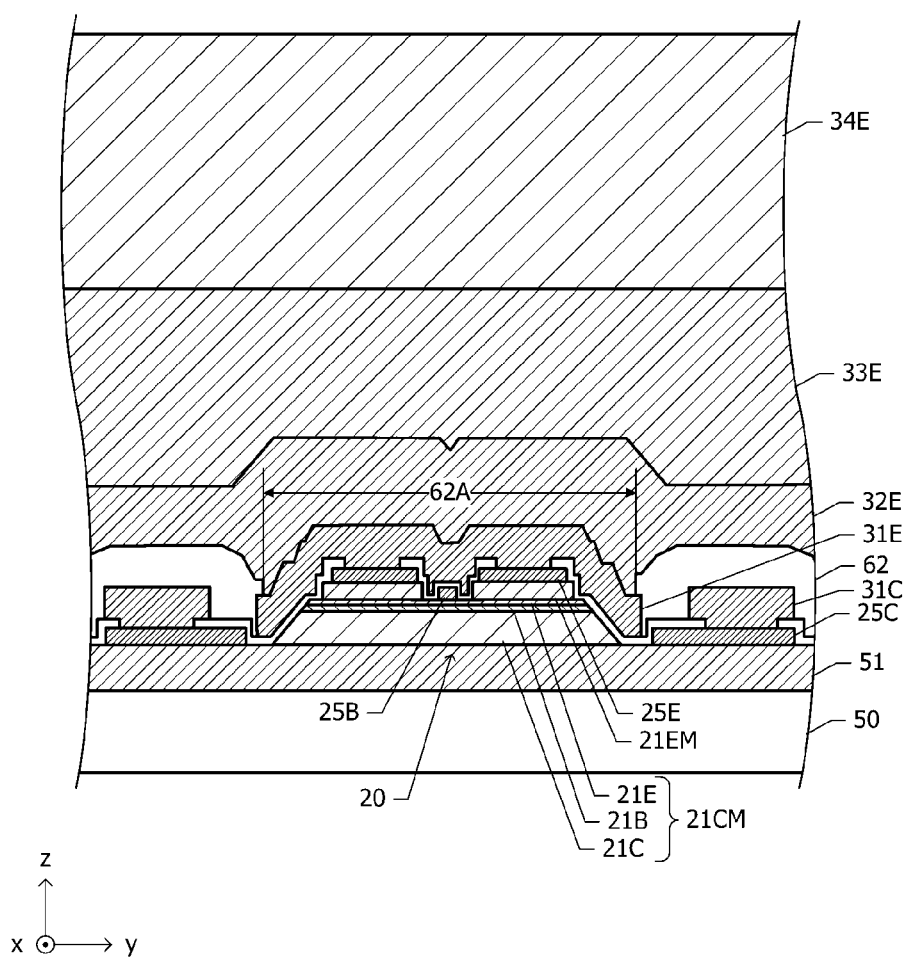
FIG. 8 is a cross-sectional view of part of a semiconductor device according to a modification of the second embodiment.

FIG. 8 is a cross-sectional view of part of a semiconductor device according to the modification of the second embodiment. In the second embodiment (FIG. 6), the position in the y direction of the side face of the collector electrode 25C, which is opposed to the collector mesa 21CM, substantially coincides with the position in they direction of the side face of the collector line 31C, which is opposed to the collector mesa 21CM. In contrast, in the modification of the second embodiment, the side face of the collector electrode 25C, which is opposed to the collector mesa 21CM, is closer to the collector mesa 21CM than the side face of the collector line 31C, which is opposed to the collector mesa 21CM. Since the collector electrode 25C is made closer to the collector mesa 21CM, it is possible to suppress the increase in the collector parasitic resistance.

Third Embodiment

A semiconductor device according to a third embodiment will now be described with reference to FIG. 9. A description of the components common to the semiconductor device (FIG. 1, FIG. 2, and FIG. 3) according to the first embodiment is omitted herein.

Figure 9:
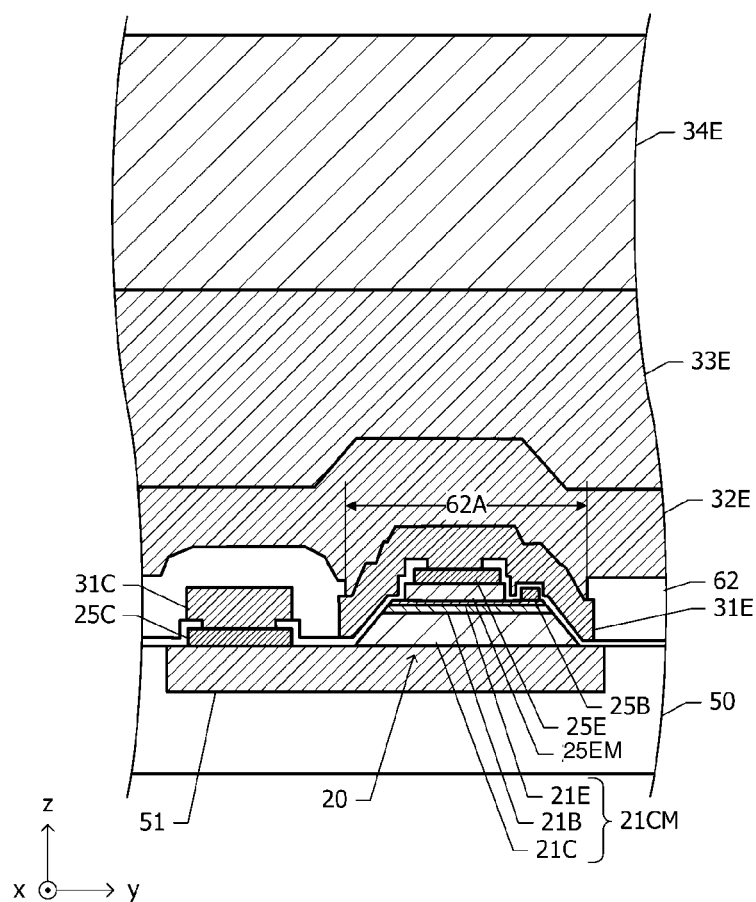
FIG. 9 is a cross-sectional view of part of a semiconductor device according to a third embodiment.

FIG. 9 is a cross-sectional view of part of the semiconductor device according to the third embodiment. In the semiconductor device (FIG. 2 and FIG. 3) according to the first embodiment, the two emitter mesas 21EM are arranged on the top face of each of the collector mesas 21CM and the emitter electrode 25E is arranged on each of the two emitter mesas 21EM. In addition, the collector electrode 25C is arranged on each side of each of the collector mesas 21CM. In contrast, in the third embodiment, one emitter mesa 25EM is arranged on the top face of each of the collector mesas 21CM.

The emitter electrode 25E is arranged on the emitter mesa 25EM, and the base electrode 25B is arranged at a position adjacent to the collector mesa 21CM in they direction. The collector electrode 25C is arranged at one side in the y direction of the collector mesa 21CM. In a plan view, one collector mesa 21CM and one collector electrode 25C are arranged on the inner side of one sub-collector layer 51. Focusing on one transistor 20, the collector electrode 25C, the emitter electrode 25E, and the base electrode 25B are arranged in line in this order in the y direction.

The first-layer emitter line 31E extends in the y direction from the top face of the collector mesa 21CM to positions exceeding the margins of the bottom face of the collector mesa 21CM across the tilting side faces extending in the x direction of the collector mesa 21CM. In other words, the range in the y direction, in which the first-layer emitter line 31E is arranged, includes the range in the y direction, in which the collector mesa 21CM is arranged. The range in the y direction, in which the opening 62A with which the first-layer emitter line 31E is connected to the second-layer emitter line 32E is arranged, also includes the range in the y direction, in which the collector mesa 21CM is arranged.

The configuration may be adopted also in the third embodiment in which the first-layer emitter line 31E extends in the y direction from the area where the first-layer emitter line 31E is overlapped with the top face of the collector mesa 21CM across the margins of the top face but does not reach the margins of the bottom face of the collector mesa 21CM, as in the first embodiment (FIG. 3).

The advantages of the third embodiment will now be described. The advantage of reducing the thermal resistance of the heat transfer path from the transistors 20 to the emitter bump 34E is achieved also in the third embodiment, as in the first embodiment. Accordingly, it is possible to suppress the degradation of the characteristics due to the increase in the temperature of the transistors 20.

A semiconductor device according to a modification of the third embodiment will now be described with reference to FIG. 10.

Figure 10:
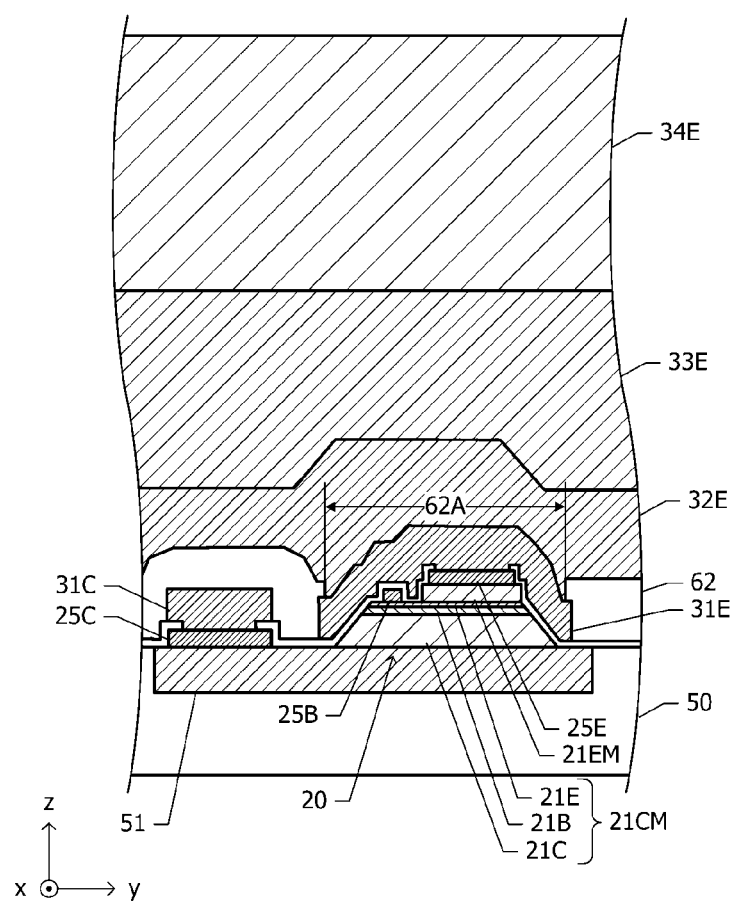
FIG. 10 is a cross-sectional view of part of a semiconductor device according to a modification of the third embodiment.

FIG. 10 is a cross-sectional view of part of the semiconductor device according to the modification of the third embodiment. In the third embodiment (FIG. 9), the collector electrode 25C, the emitter electrode 25E, and the base electrode 25B are arranged in this order in the y direction. In contrast, in the modification of the third embodiment, the order of arrangement of the emitter electrode 25E and the base electrode 25B is reversed. Specifically, the collector electrode 25C, the base electrode 25B, and the emitter electrode 25E are arranged in this order in the y direction.

The advantage of reducing the thermal resistance of the heat transfer path from the transistors 20 to the emitter bump 34E is achieved, as in the third embodiment, even when the order of arrangement of the emitter electrode 25E and the base electrode 25B is reversed, as in the modification of the third embodiment. Accordingly, it is possible to suppress the degradation of the characteristics due to the increase in the temperature of the transistors 20.

Fourth Embodiment

A semiconductor device according to a fourth embodiment will now be described with reference to FIG. 11, FIG. 12, and FIG. 13. A description of the components common to the semiconductor device (FIG. 1, FIG. 2, and FIG. 3) according to the first embodiment is omitted herein.

Figure 11:
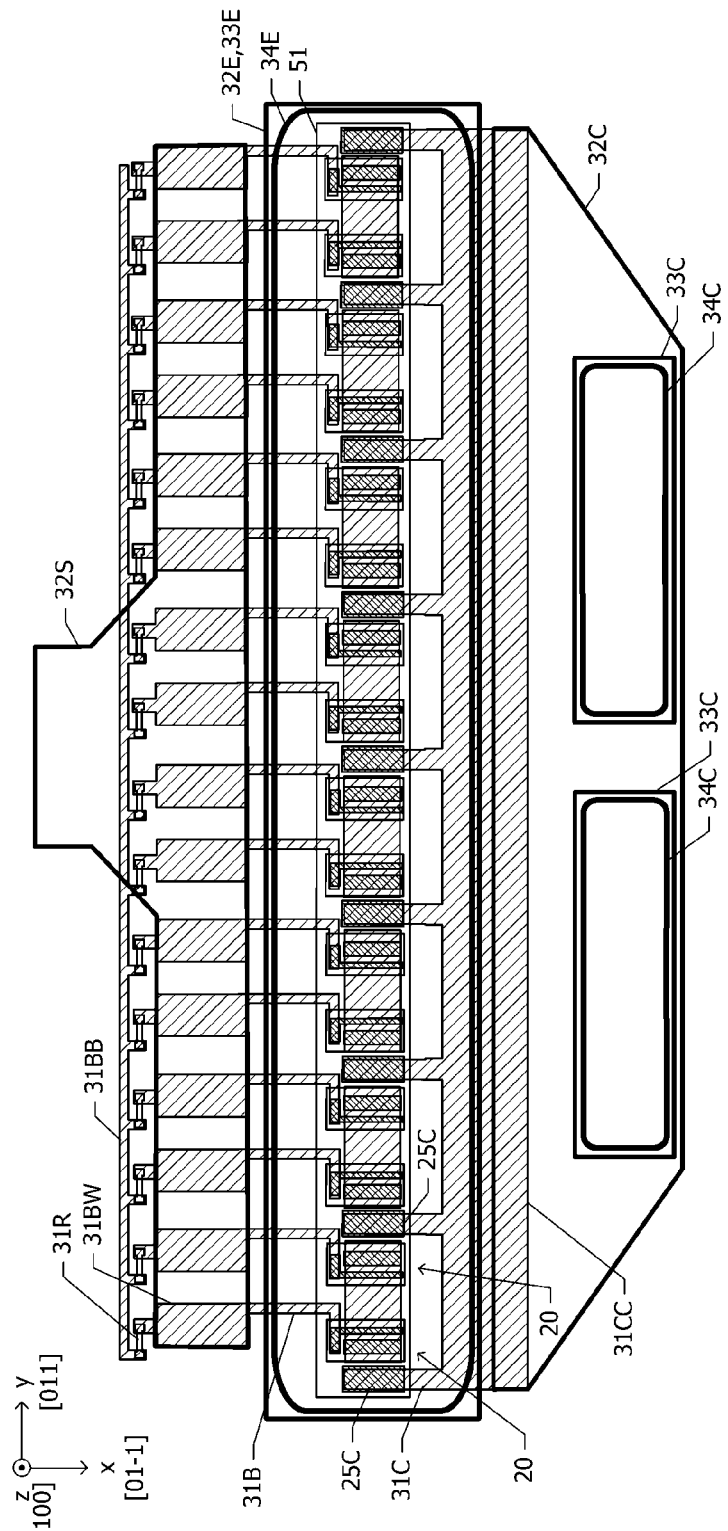
FIG. 11 is a diagram illustrating the positional relationship in a plan view between the respective components in a semiconductor device according to a fourth embodiment.

FIG. 11 is a diagram illustrating the positional relationship in a plan view between the respective components in the semiconductor device according to the fourth embodiment. The collector electrodes 25C, the base electrodes 25B, and the emitter electrodes 25E are subjected to right upward hatching and the first-layer lines are subjected to right downward hatching also in FIG. 11, as in FIG. 1. The right downward hatching is rougher than the hatching added to the collector electrodes 25C and so on.

In the first embodiment (FIG. 1), the multiple transistors 20 and the multiple collector electrodes 25C are alternately arranged in the y direction. Focusing on one transistor 20, the collector electrode 25C is arranged on each side in the y direction. In contrast, in the fourth embodiment, the collector electrode 25C is arranged for every two transistors 20 aligned in the y direction. Focusing on one transistor 20, the collector electrode 25C is arranged at one side in the y direction while the collector electrode 25C is not arranged and another transistor 20 is arranged at the other side in the y direction.

Figure 12:
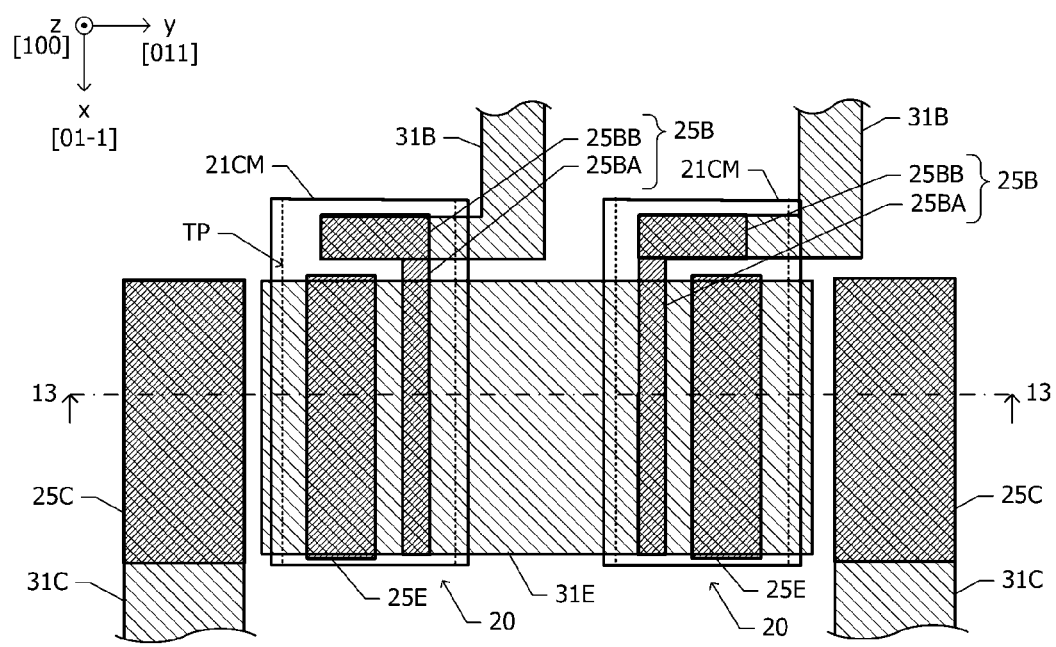
FIG. 12 is a diagram illustrating the positional relationship in a plan view between two transistors that are adjacent to each other and the components near the two transistors in the semiconductor device according to the fourth embodiment.
Figure 13:
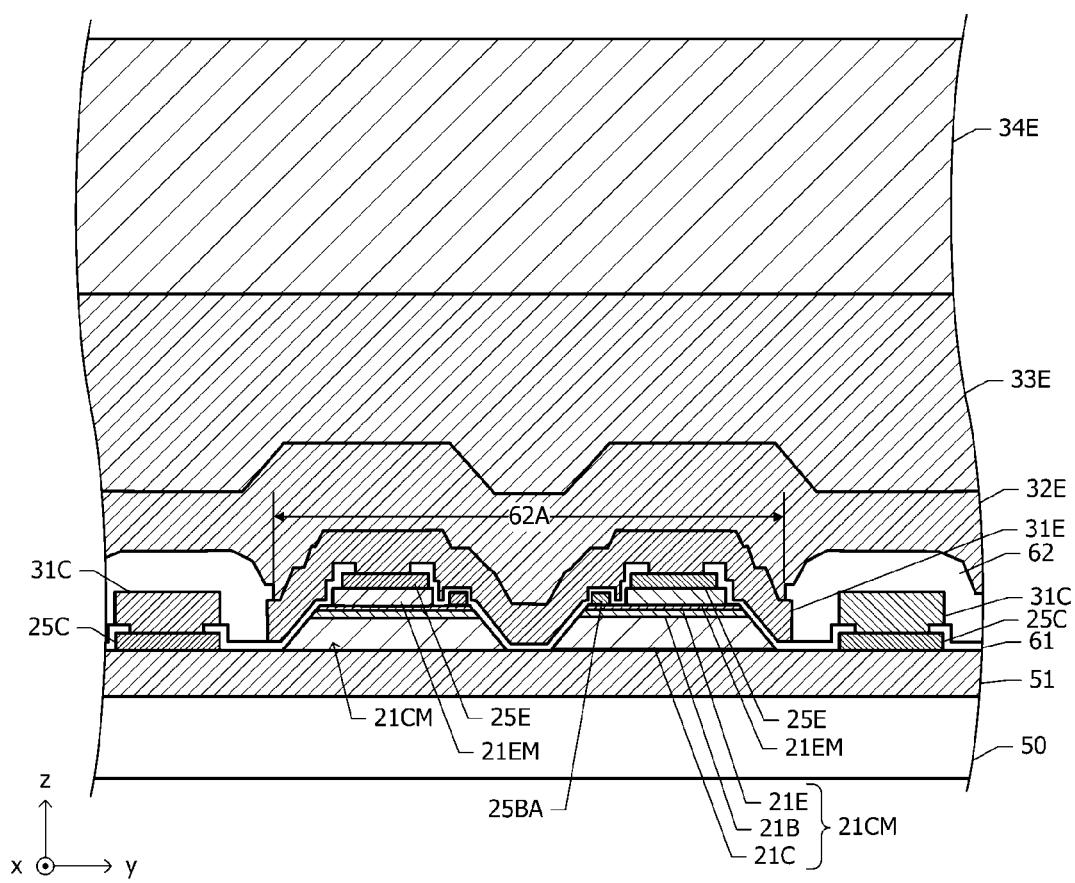
FIG. 13 is a cross-sectional view taken along the alternate long and short dash line 13-13 in FIG. 12.

FIG. 12 is a diagram illustrating the positional relationship in a plan view between two transistors 20 that are adjacent to each other and the components near the two transistors 20 in the semiconductor device according to the fourth embodiment. FIG. 13 is a cross-sectional view taken along the alternate long and short dash line 13-13 in FIG. 12. The two collector mesas 21CM are arranged in line in the y direction. The collector electrode 25C is not arranged between the two collector mesas 21CM. The collector electrode 25C is arranged at each of two positions sandwiching the two collector mesas 21CM in the y direction.

In a plan view, the emitter electrode 25E and the base electrode 25B are arranged on the top face of each of the two collector mesas 21CM. The main portions 25BA of the two base electrodes 25B are arranged between the two emitter electrodes 25E. The emitter electrode 25E and the base electrode 25B in one collector mesa 21CM is bilaterally symmetrical to the emitter electrode 25E and the base electrode 25B in the other collector mesa 21CM in the y direction.

The first-layer base line 31B is connected to each of the contact portions 25BB of the two base electrodes 25B. The first-layer collector line 31C is connected to each of the two collector electrodes 25C.

The first-layer emitter line 31E extends in the y direction from an area where the first-layer emitter line 31E is overlapped with one emitter electrode 25E to an area where the first-layer emitter line 31E is overlapped with the other emitter electrode 25E across the main portions 25BA of the two base electrodes 25B. In addition, the first-layer emitter line 31E extends in the y direction toward the respective collector electrodes 25C from the top faces of the collector mesas 21CM to positions exceeding the margins of the bottom faces of the collector mesas 21CM across the margins of the top faces of the collector mesas 21CM and the tilting side faces.

The opening 62A with which the first-layer emitter line 31E is connected to the second-layer emitter line 32E also continuously expands in the y direction from one collector mesa 21CM to the other collector mesa 21CM. In addition, the opening 62A expands in the y direction from the end portion of the bottom face of each collector mesa 21CM at the side opposed to the collector electrode 25C to the outside of the collector mesa 21CM.

The advantages of the fourth embodiment will now be described. The advantage of reducing the thermal resistance of the heat transfer path from the transistors 20 to the emitter bump 34E is achieved in the fourth embodiment, as in the first embodiment. Accordingly, it is possible to suppress the degradation of the characteristics due to the increase in the temperature of the transistors 20. In addition, the number of the collector electrodes 25C in the fourth embodiment (FIG. 11) is smaller than that in the first embodiment (FIG. 1). Accordingly, it is possible to reduce the dimension in the y direction, which is occupied by the multiple transistors 20, on the substrate 50. As a result, it is possible to reduce the chip size.

A semiconductor device according to a modification of the fourth embodiment will now be described with reference to FIG. 14.

Figure 14:
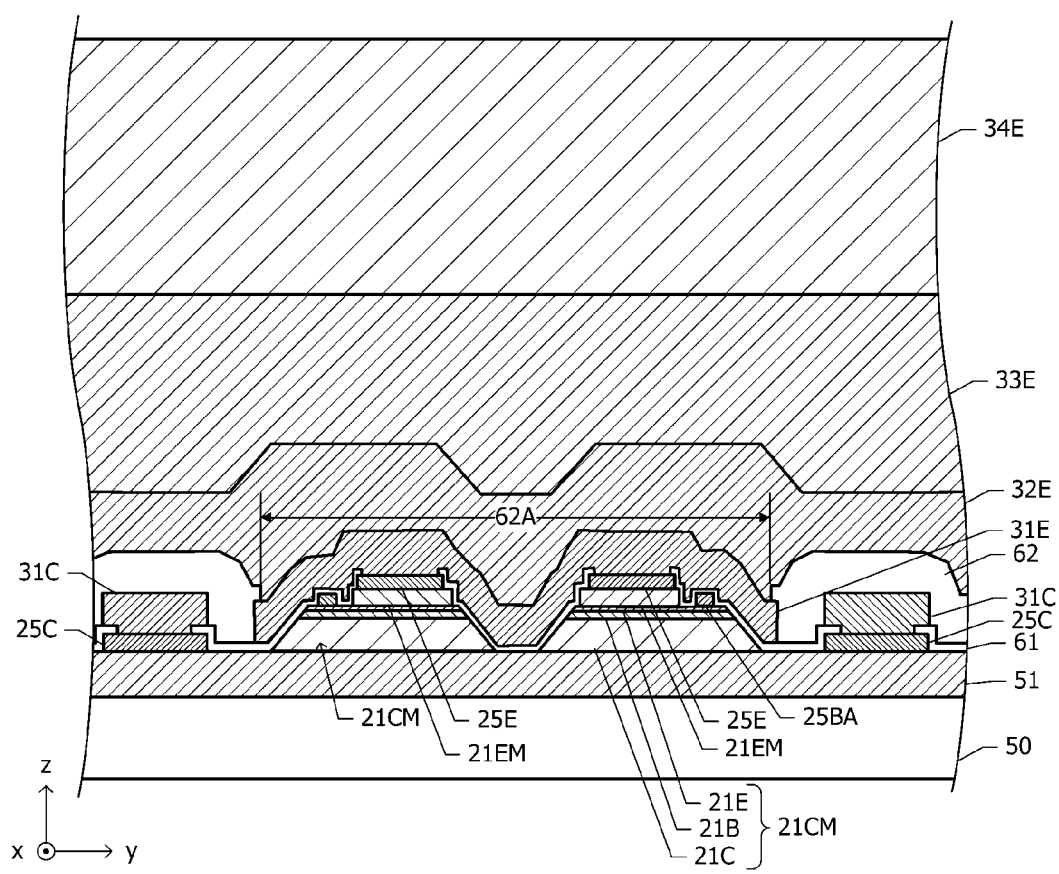
FIG. 14 is a cross-sectional view of part of a semiconductor device according to a modification of the fourth embodiment.

FIG. 14 is a cross-sectional view of part of the semiconductor device according to the modification of the fourth embodiment. In the fourth embodiment (FIG. 12 and FIG. 13), focusing on the two transistors 20 that are adjacent to each other in the y direction without the collector electrode 25C sandwiched therebetween, the main portions 25BA of the two base electrodes 25B are arranged between the two emitter electrodes 25E. In contrast, in the modification of the fourth embodiment, the two emitter electrodes 25E are arranged between the two base electrodes 25B.

The first-layer emitter line 31E extends in the y direction from areas where the first-layer emitter line 31E is overlapped with the emitter electrodes 25E to positions exceeding the margins of the bottom faces of the collector mesas 21CM across the main portions 25BA of the base electrodes 25B and the tilting side faces of the collector mesas 21CM in a plan view.

Also in the modification of the fourth embodiment, it is possible to suppress the degradation of the characteristics due to the increase in the temperature of the transistors 20 and to reduce the chip size, as in the fourth embodiment.

Fifth Embodiment

A semiconductor device according to a fifth embodiment will now be described with reference to FIG. 15, FIG. 16, and FIG. 17. The semiconductor device according to the fifth embodiment includes the semiconductor device according to any of the first embodiment to the fourth embodiment.

Figure 15:
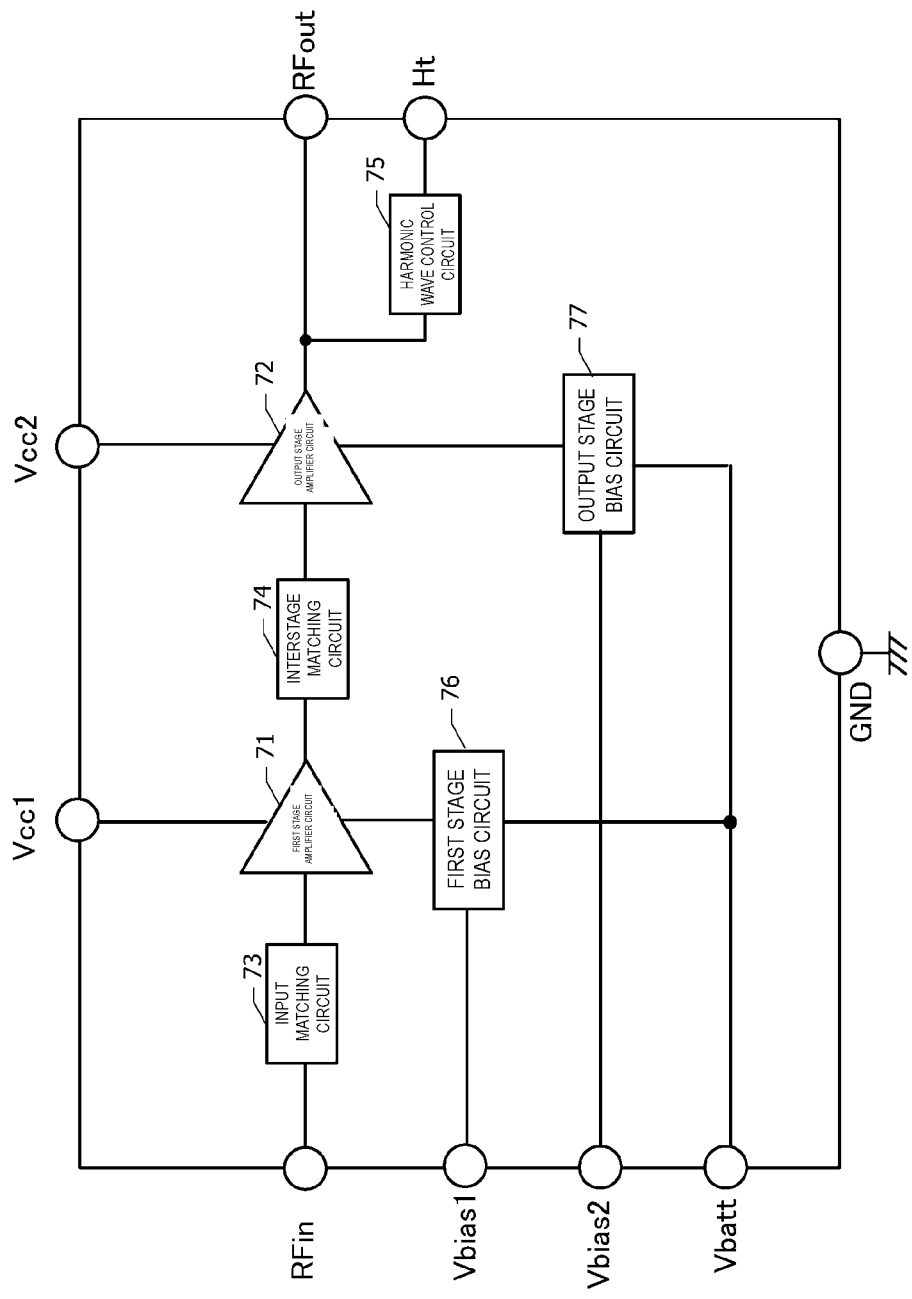
FIG. 15 is a block diagram of a semiconductor device according to a fifth embodiment.

FIG. 15 is a block diagram of the semiconductor device according to the fifth embodiment. The semiconductor device according to the fifth embodiment includes a first stage amplifier circuit 71, an output stage amplifier circuit 72, an input matching circuit 73, an interstage matching circuit 74, a harmonic wave control circuit 75, a first stage bias circuit 76, and an output stage bias circuit 77. The semiconductor device according to the fifth embodiment further has a radio-frequency signal input terminal RFin, a radio-frequency signal output terminal RFout, a first stage bias control terminal Vbias1, an output stage bias control terminal Vbias2, power terminals Vcc1 and Vcc2, a bias power terminal Vbatt, a ground terminal GND, and a terminal Ht, as external terminals composed of bumps. Although only one ground terminal GND is illustrated in the block diagram in FIG. 15, the ground terminal GND is practically composed of multiple bumps.

A radio-frequency signal input through the radio-frequency signal input terminal RFin is supplied to the first stage amplifier circuit 71 through the input matching circuit 73. The radio-frequency signal amplified in the first stage amplifier circuit 71 is supplied to the output stage amplifier circuit 72 through the interstage matching circuit 74. The radio-frequency signal amplified in the output stage amplifier circuit 72 is output from the radio-frequency signal output terminal RFout through the harmonic wave control circuit 75. The semiconductor device according to any of the first embodiment to the fourth embodiment is used for the output stage amplifier circuit 72.

Power supply voltage is applied from the power terminal Vcc1 and the power terminal Vcc2 to the first stage amplifier circuit 71 and the output stage amplifier circuit 72, respectively. Bias power is supplied from the bias power terminal Vbatt to the first stage bias circuit 76 and the output stage bias circuit 77. The first stage bias circuit 76 supplies bias current to the first stage amplifier circuit 71 based on a bias control signal input through the first stage bias control terminal Vbias1. The output stage bias circuit 77 supplies bias current to the output stage amplifier circuit 72 based on a bias control signal input through the output stage bias control terminal Vbias2. In a state in which the semiconductor device is mounted on the module substrate, the terminal Ht is grounded via an inductor on the module substrate.

Figure 16:
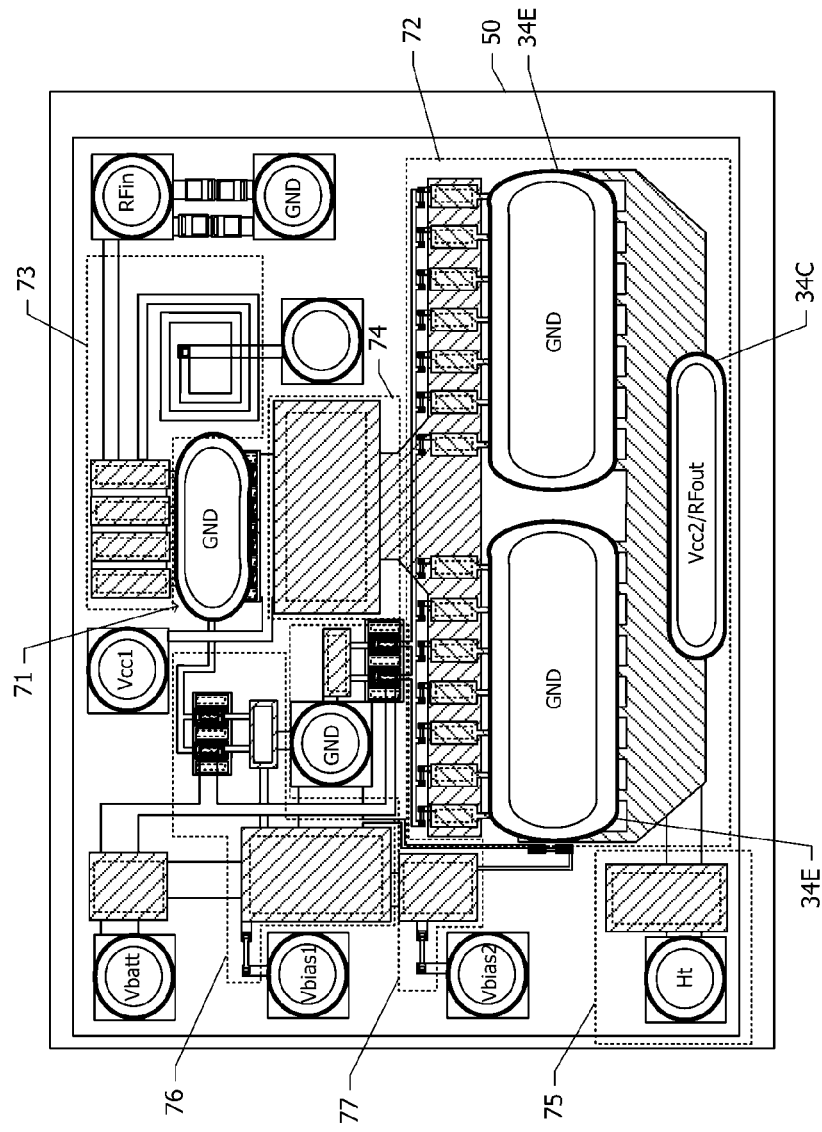
FIG. 16 is a diagram illustrating how the respective components are arranged in a substrate of the semiconductor device according to the fifth embodiment.

FIG. 16 is a diagram illustrating how the respective components are arranged in the substrate of the semiconductor device according to the fifth embodiment. The main lines on the first layer are hatched in FIG. 16.

The output stage amplifier circuit 72 occupies an area of about 40% of the top face of the substrate 50. One emitter bump 34E is arranged for the 16 transistors 20 in the first embodiment (FIG. 1) while the 14 transistors 20 are grouped into two groups and the emitter bump 34E is arranged for each of the two groups in the fifth embodiment. The emitter bump 34E corresponds to the ground terminal GND (FIG. 15). The two collector bumps 34C are arranged for the 16 transistors 20 in the first embodiment (FIG. 1) while one collector bump 34C is arranged for the 14 transistors 20 in the fifth embodiment. The collector bump 34C corresponds to the power terminal Vcc2 and the radio-frequency signal output terminal RFout (FIG. 15).

In addition to the components described above, the first stage amplifier circuit 71, the input matching circuit 73, the interstage matching circuit 74, the harmonic wave control circuit 75, the first stage bias circuit 76, the output stage bias circuit 77, the radio-frequency signal input terminal RFin, the radio-frequency signal output terminal RFout, the power terminal Vcc1, the bias power terminal Vbatt, the first stage bias control terminal Vbias1, the output stage bias control terminal Vbias2, and the terminal Ht are arranged on the top face of the substrate 50. Furthermore, the ground terminal GND and so on connected to the emitters of the multiple transistors included in the first stage amplifier circuit 71 are arranged.

Figure 17:
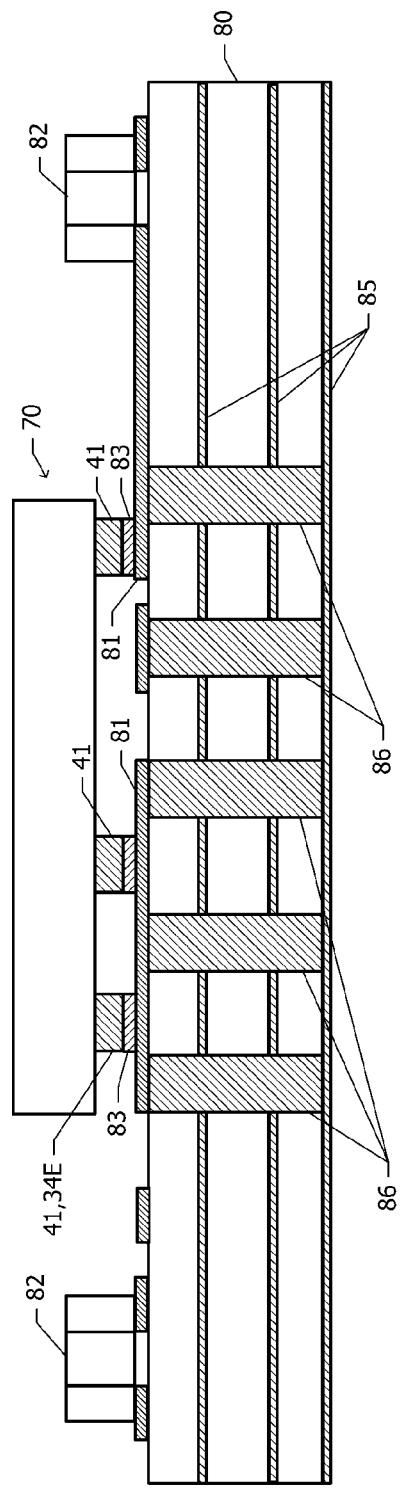
FIG. 17 is a schematic cross-sectional view in a state in which a semiconductor device according to the fifth embodiment is mounted on a module substrate.

FIG. 17 is a schematic cross-sectional view in a state in which a semiconductor device 70 according to the fifth embodiment is mounted on a module substrate 80. Multiple ground bumps 41 are arranged on one face of the semiconductor device 70. Ground lands 81 are arranged on a mounting face of the module substrate 80. The ground bumps 41 on the semiconductor device 70 are connected to the ground lands 81 on the module substrate 80 with solder 83. Two ground bumps 41 in the multiple ground bumps 41 correspond to the emitter bumps 34E (FIG. 16).

Power bumps and signal bumps (not illustrated in FIG. 17) are arranged on the semiconductor device 70, in addition to the ground bumps 41. These bumps are also connected to the corresponding lands on the module substrate 80 with solder.

Multiple surface mount devices 82 including inductors and capacitors are mounted on the mounting face of the module substrate 80, in addition to the semiconductor device 70. Ground plane 85 are arranged in inner layers of the module substrate 80 and the surface (hereinafter referred to as a rear face) opposite to the mounting face. Multiple vias 86 are provided, which extend from the ground lands 81 arranged on the mounting face to the ground plane 85 on the rear face.

The heat generated in the transistors 20 (FIG. 1 and so on) in the semiconductor device 70 is conducted to the ground lands 81 on the module substrate 80 through the emitter bumps 34E. The heat conducted to the ground lands 81 is conducted to the ground plane 85 on the rear face through the vias 86. Thermal coupling of the ground plane 85 on the rear face to a component functioning as a heat sink enables the heat conducted to the ground plane 85 to be radiated to the outside of the module substrate 80.

The advantages of the fifth embodiment will now be described. Since the semiconductor device according to any of the first embodiment to the fourth embodiment is used for the semiconductor device 70 in the fifth embodiment, the thermal resistance of the heat transfer path from the transistors 20 (FIG. 3 and so on) to the emitter bumps 34E is reduced. Accordingly, the thermal resistance of the heat transfer path from the transistors 20 to the component functioning as the heat sink via the emitter bumps 34E and the module substrate 80 is also reduced to ensure sufficient radiation from the transistors 20.

The embodiments described above are only examples and partial replacement or combination of the components described in different embodiments is available. The same advantages of the same components in multiple embodiments are not successively described in the respective embodiments. The present disclosure is not limited to the above embodiments. For example, availability of various changes, modifications, combinations, and so on is obvious to the person skilled in the art.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a substrate;
   at least one transistor including a collector layer, a base layer, and an emitter layer, which are laminated on the substrate, at least part of the collector layer and the base layer of the transistor composing a collector mesa having a substantially mesa shape, and the collector mesa having side faces tilting with respect to the substrate so that a dimension of a top face in a first direction of a plane of the substrate is smaller than a dimension of a bottom face therein;
   a first insulating film that is a first-layer interlayer insulating film with respect to the substrate, which is arranged on the substrate and which covers the transistor;
   a first-layer emitter line that is arranged on the first insulating film, that is electrically connected to the emitter layer of the transistor via an opening in the first insulating film, and that extends from an area where the first-layer emitter line is overlapped with the top face of the collector mesa to areas where the first-layer emitter line is overlapped with at least part of the tilting side faces of the collector mesa in a plan view;
   a second insulating film that is arranged on the first-layer emitter line and that has an opening included in the first-layer emitter line in a plan view; and
   a bump that is arranged on the second insulating film and that is electrically connected to the first-layer emitter line via the opening in the second insulating film,
   wherein the opening in the second insulating film expands from an area where the opening is overlapped with the top face of the collector mesa to areas where the opening is overlapped with at least part of the tilting side faces of the collector mesa in a plan view.

2. The semiconductor device according to claim 1, further comprising:
a sub-collector layer that is arranged in a surface portion of the substrate configured to connect to the collector layer of the transistor and that extends in the first direction from the collector layer of the transistor in a plan view;
at least one collector electrode that is arranged on the sub-collector layer with a spacing in the first direction from the transistor, that is electrically connected to the collector layer of the transistor via the sub-collector layer, and that is covered with the first insulating film; and
a first-layer collector line that is overlapped with the collector electrode in a plan view, that is arranged with a spacing in the first direction from the first-layer emitter line, and that is connected to the collector electrode via the opening in the first insulating film,
wherein a side face of the collector electrode, which is opposed to the collector mesa, is closer to the collector mesa than a side face of the first-layer collector line, which is opposed to the collector mesa, in a plan view.

3. The semiconductor device according to claim 1, wherein
the first-layer emitter line extends from the area where the first-layer emitter line is overlapped with the top face of the collector mesa to positions exceeding lower ends of the tilting side faces of the collector mesa in a plan view.

4. The semiconductor device according to claim 1, wherein
the at least one transistor includes a first transistor and a second transistor that are arranged in line in the first direction, and
the first-layer emitter line continuously extends from an area where the first-layer emitter line is overlapped with the first transistor to an area where the first-layer emitter line is overlapped with the second transistor in a plan view.

5. The semiconductor device according to claim 4, wherein
the opening in the second insulating film continuously expands from an area where the opening is overlapped with the first transistor to an area where the opening is overlapped with the second transistor, and the bump is electrically connected to the first-layer emitter line via the opening in the second insulating film.

6. The semiconductor device according to claim 2, wherein
the first-layer emitter line extends from the area where the first-layer emitter line is overlapped with the top face of the collector mesa to positions exceeding lower ends of the tilting side faces of the collector mesa in a plan view.

7. The semiconductor device according to claim 2, wherein
the at least one transistor includes a first transistor and a second transistor that are arranged in line in the first direction, and
the first-layer emitter line continuously extends from an area where the first-layer emitter line is overlapped with the first transistor to an area where the first-layer emitter line is overlapped with the second transistor in a plan view.

8. The semiconductor device according to claim 3, wherein
the at least one transistor includes a first transistor and a second transistor that are arranged in line in the first direction, and
the first-layer emitter line continuously extends from an area where the first-layer emitter line is overlapped with the first transistor to an area where the first-layer emitter line is overlapped with the second transistor in a plan view.

9. The semiconductor device according to claim 6, wherein
the at least one transistor includes a first transistor and a second transistor that are arranged in line in the first direction, and
the first-layer emitter line continuously extends from an area where the first-layer emitter line is overlapped with the first transistor to an area where the first-layer emitter line is overlapped with the second transistor in a plan view.

10. The semiconductor device according to claim 9, wherein
the opening in the second insulating film continuously expands from an area where the opening is overlapped with the first transistor to an area where the opening is overlapped with the second transistor, and the bump is electrically connected to the first-layer emitter line via the opening in the second insulating film.

11. The semiconductor device according to claim 7, wherein
the opening in the second insulating film continuously expands from an area where the opening is overlapped with the first transistor to an area where the opening is overlapped with the second transistor, and the bump is electrically connected to the first-layer emitter line via the opening in the second insulating film.

12. The semiconductor device according to claim 8, wherein
the opening in the second insulating film continuously expands from an area where the opening is overlapped with the first transistor to an area where the opening is overlapped with the second transistor, and the bump is electrically connected to the first-layer emitter line via the opening in the second insulating film.

13. The semiconductor device according to claim 1, wherein the opening in the second insulating film is in a range of 6.3 µm to 9.6 µm when viewed in a cross-sectional view along the substrate.

* * * * *